(12) United States Patent
Cho et al.

(10) Patent No.: US 8,907,713 B2
(45) Date of Patent: Dec. 9, 2014

(54) DEVICE AND METHOD FOR REMOVING HARMONIC COMPONENTS

(75) Inventors: Seung-Woo Cho, Hwaseong-si (KR);
Jae-Young Ryu, Suwon-si (KR);
Jong-Jin Kim, Hwaseong-si (KR);
Hyun-Koo Kang, Yongin-si (KR);
Yeon-Woo Ku, Yongin-si (KR);
Jeong-Su Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/822,993

(22) PCT Filed: Sep. 16, 2011

(86) PCT No.: PCT/KR2011/006846
§ 371 (c)(1),
(2), (4) Date: Mar. 13, 2013

(87) PCT Pub. No.: WO2012/036501
PCT Pub. Date: Mar. 22, 2012

(65) Prior Publication Data
US 2013/0169342 A1 Jul. 4, 2013

(30) Foreign Application Priority Data
Sep. 17, 2010 (KR) .................. 10-2010-0091456

(51) Int. Cl.
*G06F 7/44* (2006.01)
*G06G 7/16* (2006.01)
*H03B 21/04* (2006.01)
*H03D 7/00* (2006.01)
*H03B 1/04* (2006.01)

(52) U.S. Cl.
CPC .................. *H03B 1/04* (2013.01); *H03B 21/04* (2013.01); *H03D 7/00* (2013.01); *H03D 2200/0086* (2013.01)
USPC ............ 327/358; 327/356; 327/361; 327/355

(58) Field of Classification Search
USPC .................................................. 327/355–361
See application file for complete search history.

(56) References Cited

U.S. PATENT DOCUMENTS 5,949,830 A * 9/1999 Nakanishi ............... 375/334
6,073,001 A * 6/2000 Sokoler .................. 455/323

(Continued)

FOREIGN PATENT DOCUMENTS

KR 100872252 B1 11/2008

OTHER PUBLICATIONS

Jeffrey A. Weldon et al., "A 1.75-GHz Highly Integrated Narrow-Band CMOS Transmitter With Harmonic-Rejection Mixers," IEEE Journal of Solid-State Circuits, vol. 36, No. 12, Dec. 2001.

*Primary Examiner* — Brandon S Cole
(74) *Attorney, Agent, or Firm* — Jefferson IP Law, LLP

(57) ABSTRACT

An apparatus of a Harmonic Rejection Mixer (HRM) for removing a harmonic component and an operating method thereof are provided. The HRM includes a Local Oscillator (LO), at least one frequency converter, at least two mixers, at least one phase converter, and a combiner. The LO generates an LO signal. The at least one frequency converter multiplies the LO signal using different variables to provide the same to at least two mixers. The at least two mixers convert a frequency band of an input signal using the LO signal provided from the LO and the at least one frequency converter. The at least one phase converter controls a phase of an output signal of at least one other mixer excluding one of the at least two mixers. The combiner combines an output signal of the one mixer with an output signal of the at least one phase converter.

19 Claims, 16 Drawing Sheets

(56) References Cited

U.S. PATENT DOCUMENTS

| | | | |
|---|---|---|---|
| 6,233,444 B1* | 5/2001 | Nakanishi | 455/313 |
| 6,564,045 B1* | 5/2003 | Fransis | 455/318 |
| 6,850,748 B2* | 2/2005 | Song et al. | 455/302 |
| 7,512,394 B2* | 3/2009 | Fujii | 455/327 |
| 7,821,318 B1* | 10/2010 | Tan et al. | 327/359 |
| 2005/0239430 A1 | 10/2005 | Shah | |
| 2006/0205370 A1 | 9/2006 | Hayashi et al. | |
| 2008/0194222 A1* | 8/2008 | Liu et al. | 455/296 |
| 2008/0297414 A1* | 12/2008 | Krishnaswamy et al. | 342/368 |
| 2009/0104885 A1* | 4/2009 | Asayama et al. | 455/296 |
| 2009/0325510 A1 | 12/2009 | Pullela et al. | |
| 2010/0119022 A1 | 5/2010 | He et al. | |
| 2011/0306300 A1* | 12/2011 | Behera et al. | 455/47 |

\* cited by examiner

DEVICE AND METHOD FOR REMOVING HARMONIC COMPONENTS

BACKGROUND OF THE INVENTION

1. Field of the Invention

The present invention relates to an apparatus and a method for removing harmonic components. More particularly, the present invention relates to a Harmonic Rejection Mixer (HRM) for removing harmonic components using a plurality of Local Oscillation (LO) frequencies and an operating method thereof.

2. Description of the Related Art

Generally, a mixer is a circuit for performing a function of multiplying two input signals, and is used for down-converting a high frequency Radio Frequency (RF) signal to an Intermediate Frequency (IF) or baseband signal. Also, the mixer is used for up-converting an IF or baseband signal to an RF signal.

FIGS. 1A-1B are views illustrating an output signal of a mixer according to the conventional art.

FIG. 1A illustrates an output signal of a general mixer, and FIG. 1B illustrates an output signal of an HRM.

Generally, a mixer uses a Local Oscillation (LO) signal in order to up-convert or down-convert an input signal. The LO signal may include a harmonic component in a frequency which is an odd number-multiple of a basic frequency. Accordingly, an output signal generated by the mixer includes a harmonic component by a frequency which is an odd number-multiple (3LO, 5LO, 7LO) of a basic frequency of an LO signal.

In case of using an HRM to prevent a harmonic component from occurring, a third order harmonic component and a fifth order harmonic component may be removed as illustrated in FIG. 1B. For example, the HRM may remove a harmonic component by combining output signals generated using LO signals having the same frequency but having different phases of 0 degree, 45 degree, and 90 degree at respective mixers. At this point, the HRM may minimize a noise by a harmonic component by setting a gain of a mixer that uses an LO signal of 45 degree to 1.4 multiple of another mixer.

As described above, the HRM can remove a harmonic component by combining output signals of mixers that use different phases. That is, mixers included in the HRM are connected in a mutual supplementary manner to generate one output. Accordingly, in the case where one of mixers included in the HRM is turned off for power control, a phase and a weight should be set again using the rest of the mixers.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for removing a harmonic component using a plurality of frequency bands.

Another aspect of the present invention is to provide an apparatus and a method for removing a harmonic component using a plurality of local oscillation frequencies.

Still another aspect of the present invention is to provide an apparatus and a method for controlling power with consideration of a harmonic component included in an input signal in a Harmonic Rejection Mixer (HRM) that uses a plurality of local oscillation frequencies.

Yet another aspect of the present invention is to provide an apparatus and a method for calibrating an output signal of respective mixers in a Harmonic Rejection Mixer (HRM) that uses a plurality of local oscillation frequencies.

Still yet another aspect of the present invention is to provide an apparatus and a method for calibrating a phase of a local oscillation signal in a Harmonic Rejection Mixer (HRM) that uses a plurality of local oscillation frequencies.

In accordance with an aspect of the present invention, an apparatus of a Harmonic Rejection Mixer (HRM) for removing a harmonic component is provided. The apparatus includes a Local Oscillator (LO) for generating a Local Oscillation (LO) signal, at least one frequency converter for multiplying the LO signal using different variables to provide the same to at least two mixers, the at least two mixers for converting a frequency band of an input signal using the LO signal provided from the LO and the at least one frequency converter, at least one phase converter for controlling a phase of an output signal of at least one other mixer excluding one of the at least two mixers, and a combiner for combining an output signal of the one mixer with an output signal of the at least one phase converter.

In accordance with another aspect of the present invention, a method for removing a harmonic component using a Harmonic Rejection Mixer (HRM) is provided. The method includes: generating a Local Oscillation (LO) signal, multiplying an LO signal to be provided to each of at least one other mixer excluding one of at least two mixers using different variables, mixing, at the at least two mixers, one of the LO signal and the multiplied LO signal with an input signal to generate at least two signals whose frequency bands have been converted, controlling a phase of at least one other signal excluding one of the at least two signals, and combining the one signal with the phase-controlled at least one other signal.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

Exemplary embodiments of the present invention provide a Harmonic Rejection Mixer (HRM) for removing a harmonic component using a plurality of LO frequencies and an operating technology thereof.

The following description is made using an HRM of a reception end as an example. Accordingly, it is assumed that the HRM down-converts an RF signal to an IF signal. However, the HRM is also applicable to a transmission end. That is, the present invention is applicable to a case where the HRM up-converts a baseband signal or an IF signal to an RF signal.

In the following description, an LO signal and a LO frequency are used in the same meaning.

In the following description, it is assumed that the HRM includes three mixers. However, the HRM may include three or more mixers.

Figure 1A:
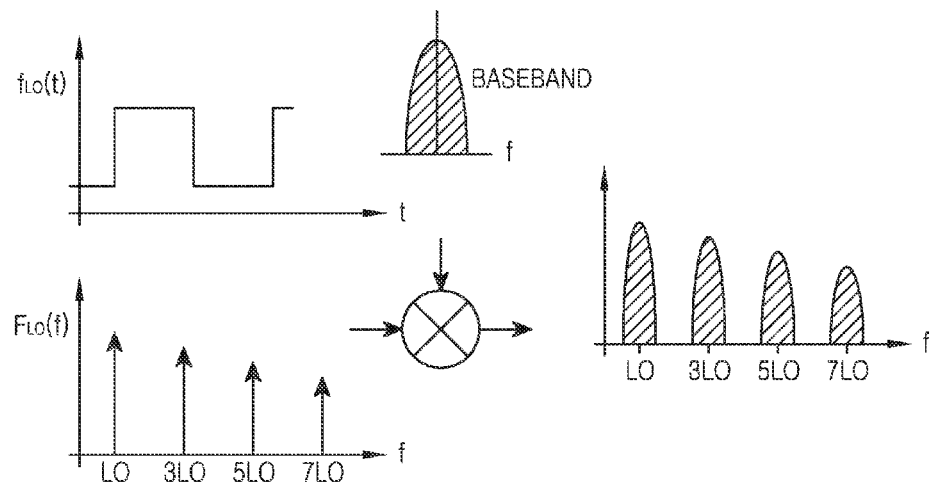
FIGS. 1A-1B are views illustrating an output signal of a mixer according to the conventional art.
Figure 1B:
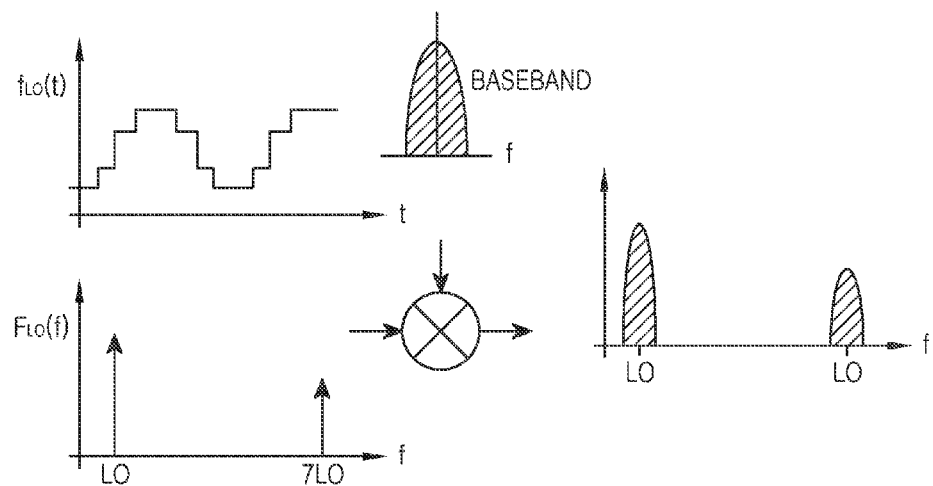
Figure 2:
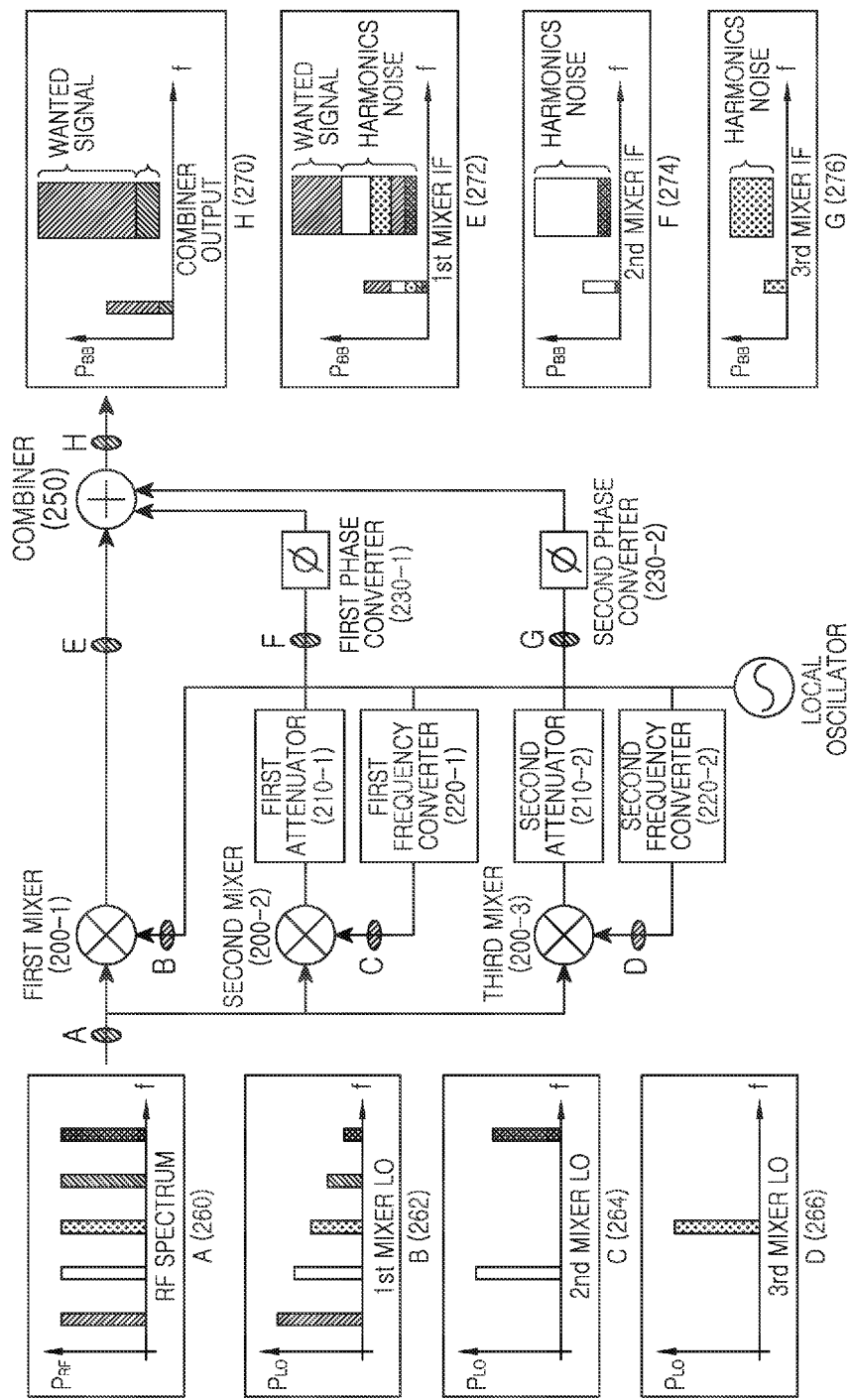
FIG. 2 is a block diagram of an HRM according to an exemplary embodiment of the present invention.

FIG. 2 is a block diagram of an HRM according to an exemplary embodiment of the present invention.

Referring to FIG. 2, the HRM includes mixers 200-1, 200-2, 200-3, attenuators 210-1, 210-2, frequency converters 220-1, 220-2, phase converters 230-1, 230-2, a Local Oscillator (LO) 240, and a combiner 250.

The LO 240 generates a LO signal in order to down-convert input signals of the mixers 200-1, 200-2, 200-3.

The first mixer 200-1 down-converts an input signal using an LO signal generated by the LO 240. For example, the first mixer 200-1 multiples an LO signal 262 of a B shape generated by the LO 240 by an input signal 260 of an A shape to generate a signal 272 of an E shape.

The first frequency converter 220-1 multiplies three times an LO signal generated by the LO 240 in order to generate a frequency three times-greater than a basic frequency. Here, the basic frequency denotes a frequency band by an LO signal generated by the LO 240.

The second mixer 220-2 down-converts an input signal using an LO signal multiplied by the first frequency converter 220-1. For example, the second mixer 220-2 multiplies an LO signal 264 of a C shape multiplied by the first frequency converter 220-1 by an input signal 260 of the shape A to output a down-converted signal.

The first attenuator 210-1 controls the magnitude of an output signal of the second mixer 200-2 so that the magnitude of an output signal of the second mixer 200-2 may be the same as the magnitude of a harmonic component included in an output signal of the first mixer 200-1. For example, the first attenuator 210-1 controls the magnitude of an output signal of the second mixer 200-2 to generate a signal 274 of an F shape.

In the case where the combiner 250 combines signals, the first phase converter 230-1 changes the phase of a signal provided from the first attenuator 210-1 so that the signal provided from the first attenuator 210-1 may be removed from an output signal of the first mixer 200-1.

The second frequency converter 220-2 multiplies five times an LO signal generated by the LO 240 in order to generate a frequency five times-greater than the basic frequency.

The third mixer 200-3 down-converts an input signal using an LO signal multiplied by the second frequency converter 220-2. For example, the third mixer 200-3 multiplies an LO signal 266 of a D shape multiplied by the second frequency converter 220-2 by an input signal 260 of an A shape to output a down-converted signal.

The second attenuator 210-2 controls the magnitude of an output signal of the third mixer 200-3 so that the magnitude of an output signal of the third mixer 200-3 may be the same as the magnitude of a harmonic component included in an output signal of the first mixer 200-1. For example, the second attenuator 210-2 controls the magnitude of an output signal of the third mixer 200-3 to generate a signal 276 of a G shape.

In the case where the combiner 250 combines signals, the second phase converter 230-2 changes the phase of a signal provided from the second attenuator 210-2 so that the signal provided from the second attenuator 210-2 may be removed from an output signal of the first mixer 200-1.

The combiner 250 combines an output signal of the first mixer 200-1 with signals provided from the first phase converter 230-1 and the second phase converter 230-2. For example, the combiner 250 combines an output signal 272 of the first mixer 200-1 with signals provided from the first phase converter 230-1 and the second phase converter 230-2 to output a signal 270 of an H shape where harmonic components have been removed. That is, the combiner 250 outputs the signal 270 of the H shape which is obtained by removing third order and ninth order harmonic components included in a signal 274 of an F shape and a fifth order harmonic component included in a signal 276 of a G shape from the signal 272 of the E shape.

The HRM configured as described above can remove harmonic components using a plurality of frequency local signals. At this point, the construction of the HRM may be transformed as illustrated in FIGS. 3 to 9.

Figure 3:
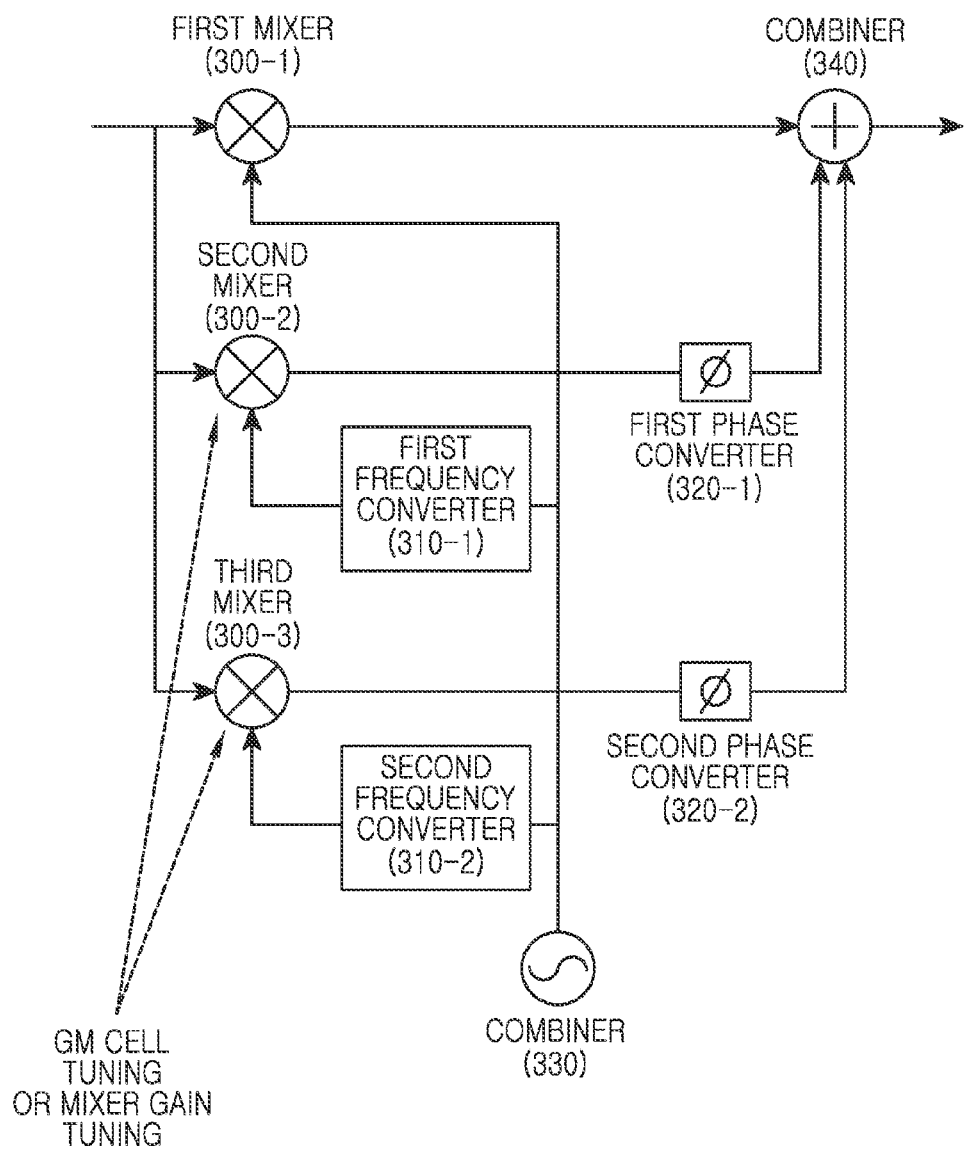
FIG. 3 is a block diagram of an HRM according to another exemplary embodiment of the present invention.

FIG. 3 illustrates an HRM according to another exemplary embodiment of the present invention.

As illustrated in FIG. 3, the HRM includes mixers 300-1, 300-2, 300-3, frequency converters 310-1, 310-2, phase converters 320-1, 320-2, an LO 330, and a combiner 340.

The LO 330 generates an LO signal in order to down-convert input signals of the mixers 300-1, 300-2, 300-3.

The first mixer 300-1 down-converts an input signal using an LO signal generated by the LO 330.

The first frequency converter 310-1 multiplies three times an LO signal generated by the LO 330 in order to generate a frequency three times-greater than a basic frequency.

The second mixer 300-2 down-converts an input signal using an LO signal multiplied by the first frequency converter 310-1. At this point, the second mixer 300-2 controls the magnitude of the down-converted signal according to a gain set in advance or a $G_m$ cell so that the magnitude of the down-converted signal may be the same as the magnitude of a harmonic component included in an output signal of the first mixer 300-1.

In the case where the combiner 340 combines signals, the first phase converter 320-1 changes the phase of an output signal of the second mixer 300-2 so that the output signal of the second mixer 300-2 may be removed from an output signal of the first mixer 300-1.

The second frequency converter 310-2 multiplies five times an LO signal generated by the LO 330 in order to generate a frequency five times-greater than the basic frequency.

The third mixer 300-3 down-converts an input signal using an LO signal multiplied by the second frequency converter 310-2. At this point, the third mixer 300-3 controls the magnitude of the down-converted signal according to a gain set in advance or a $G_m$ cell so that the magnitude of the down-converted signal may be the same as the magnitude of a harmonic component included in an output signal of the first mixer 300-1.

In the case where the combiner 340 combines signals, the second phase converter 320-2 changes the phase of a signal provided from the third mixer 300-3 so that the output signal of the third mixer 300-3 may be removed from an output signal of the first mixer 300-1.

The combiner 340 combines an output signal of the first mixer 300-1 with signals provided from the first phase converter 320-1 and the second phase converter 320-2 to output a harmonic component-removed signal.

Figure 4:
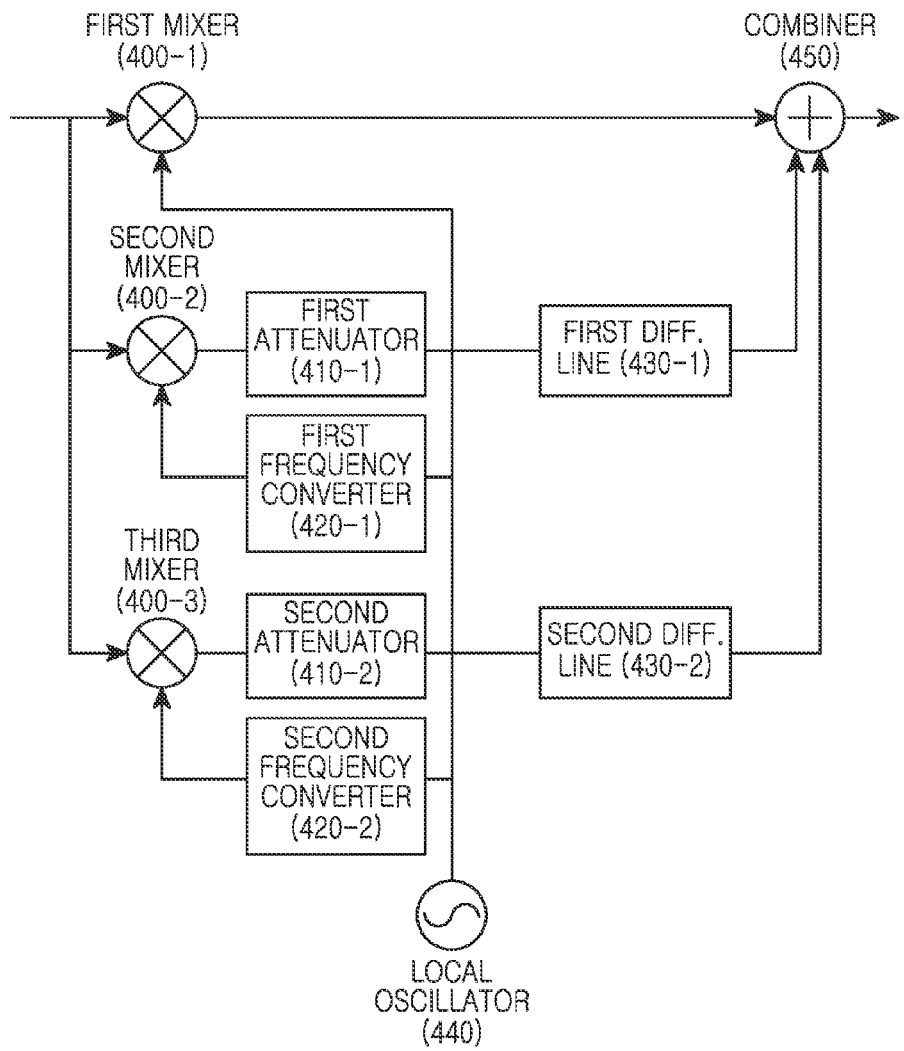
FIG. 4 is a block diagram of an HRM according to a further another exemplary embodiment of the present invention.

FIG. 4 is a block diagram of an HRM according to a further another exemplary embodiment of the present invention.

As illustrated in FIG. 4, the HRM includes mixers 400-1, 400-2, 400-3, attenuators 410-1, 410-2, frequency converters 420-1, 420-2, converting lines (Diff. lines) 430-1, 430-2, an LO 440, and a combiner 450.

The LO 440 generates an LO signal in order to down-convert input signals of the mixers 400-1, 400-2, 400-3.

The first mixer 400-1 down-converts an input signal using an LO signal generated by the LO 440.

The first frequency converter 420-1 multiplies three times an LO signal generated by the LO 440 in order to generate a frequency three times-greater than a basic frequency.

The second mixer 400-2 down-converts an input signal using an LO signal multiplied by the first frequency converter 420-1.

The first attenuator 410-1 controls the magnitude of an output signal of the second mixer 400-2 so that the magnitude of an output signal of the second mixer 400-2 may be the same as the magnitude of a harmonic component included in an output signal of the first mixer 400-1.

The first converting line 430-1 changes the phase of a signal provided from the first attenuator 410-1 by 180 degree. For example, the first converting line 430-1 changes the sign of a signal provided from the first attenuator 410-1.

The second frequency converter 420-2 multiplies five times an LO signal generated by the LO 440 in order to generate a frequency five times-greater than the basic frequency.

The third mixer 400-3 down-converts an input signal using an LO signal multiplied by the second frequency converter 420-2.

The second attenuator 410-2 controls the magnitude of an output signal of the third mixer 400-3 so that the magnitude of an output signal of the third mixer 400-3 may be the same as the magnitude of a harmonic component included in an output signal of the first mixer 400-1.

The second converting line 430-2 changes the phase of a signal provided from the second attenuator 410-2 by 180 degree. For example, the second converting line 430-2 changes the sign of a signal provided from the second attenuator 410-2.

The combiner 450 combines an output signal of the first mixer 400-1 with signals provided from the first converting line 430-1 and the second converting line 430-2 to output a harmonic component-removed signal.

Figure 5:
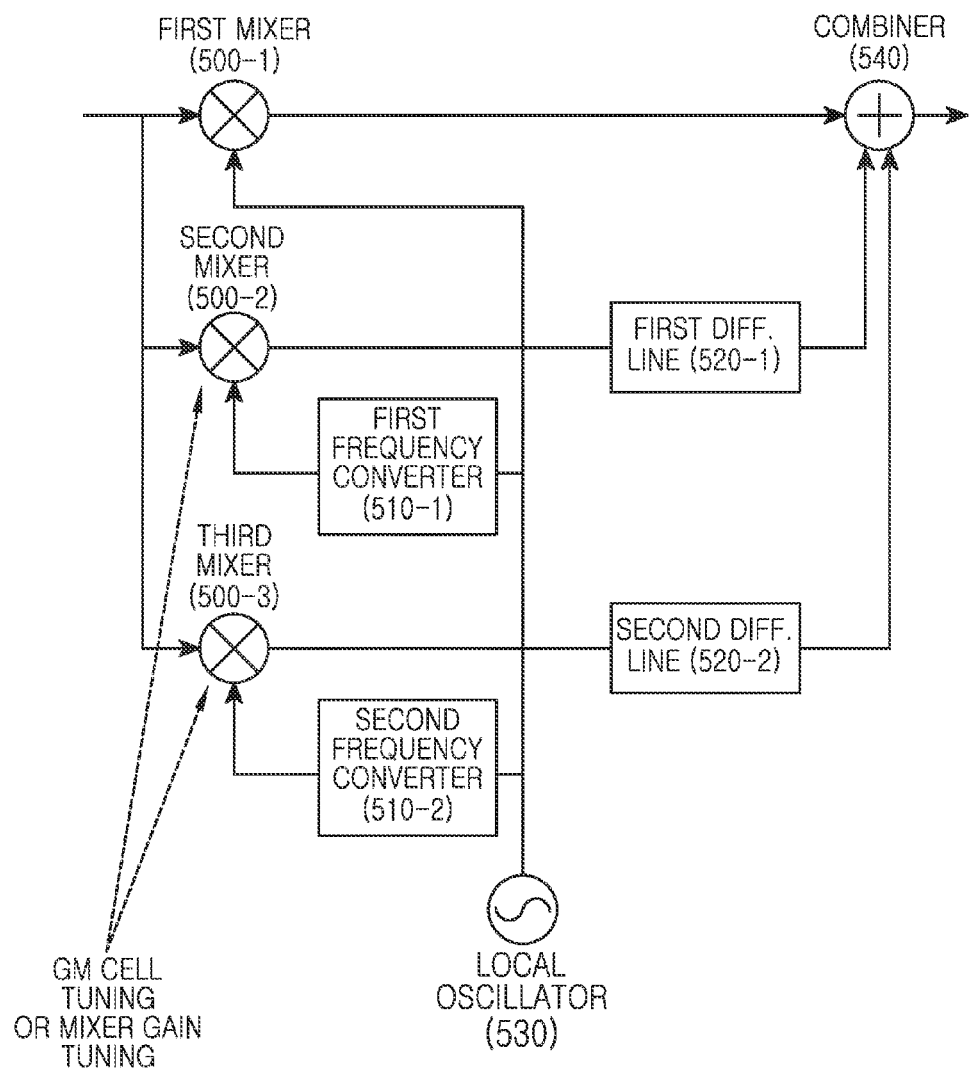
FIG. 5 is a block diagram of an HRM according to yet another exemplary embodiment of the present invention.

FIG. 5 is a block diagram of an HRM according to yet another exemplary embodiment of the present invention.

As illustrated in FIG. 5, the HRM includes mixers 500-1, 500-2, 500-3, frequency converters 510-1, 510-2, converting lines (Diff. lines) 520-1, 520-2, an LO 530, and a combiner 540.

The LO 530 generates an LO signal in order to down-convert input signals of the mixers 500-1, 500-2, 500-3.

The first mixer 500-1 down-converts an input signal using an LO signal generated by the LO 530.

The first frequency converter 510-1 multiplies three times an LO signal generated by the LO 530 in order to generate a frequency three times-greater than a basic frequency.

The second mixer 500-2 down-converts an input signal using an LO signal multiplied by the first frequency converter 510-1. At this point, the second mixer 500-2 controls the magnitude of the down-converted signal according to a gain set in advance or a $G_m$ cell so that the magnitude of the down-converted signal may be the same as the magnitude of a harmonic component included in an output signal of the first mixer 500-1.

The first converting line 520-1 changes the phase of a signal provided from the second mixer 500-2 by 180 degree. For example, the first converting line 520-1 changes the sign of a signal provided from the second mixer 500-2.

The second frequency converter 510-2 multiplies five times an LO signal generated by the LO 530 in order to generate a frequency five times-greater than the basic frequency.

The third mixer 500-3 down-converts an input signal using an LO signal multiplied by the second frequency converter 510-2. At this point, the third mixer 500-3 controls the magnitude of the down-converted signal according to a gain set in advance or a $G_m$ cell so that the magnitude of the down-converted signal may be the same as the magnitude of a harmonic component included in an output signal of the first mixer 500-1.

The second converting line 520-2 changes the phase of a signal provided from the third mixer 500-3 by 180 degree. For example, the second converting line 520-2 changes the sign of a signal provided from the third mixer 500-3.

The combiner 540 combines an output signal of the first mixer 500-1 with signals provided from the first converting line 520-1 and the second converting line 520-2 to output a harmonic component-removed signal.

Figure 6:
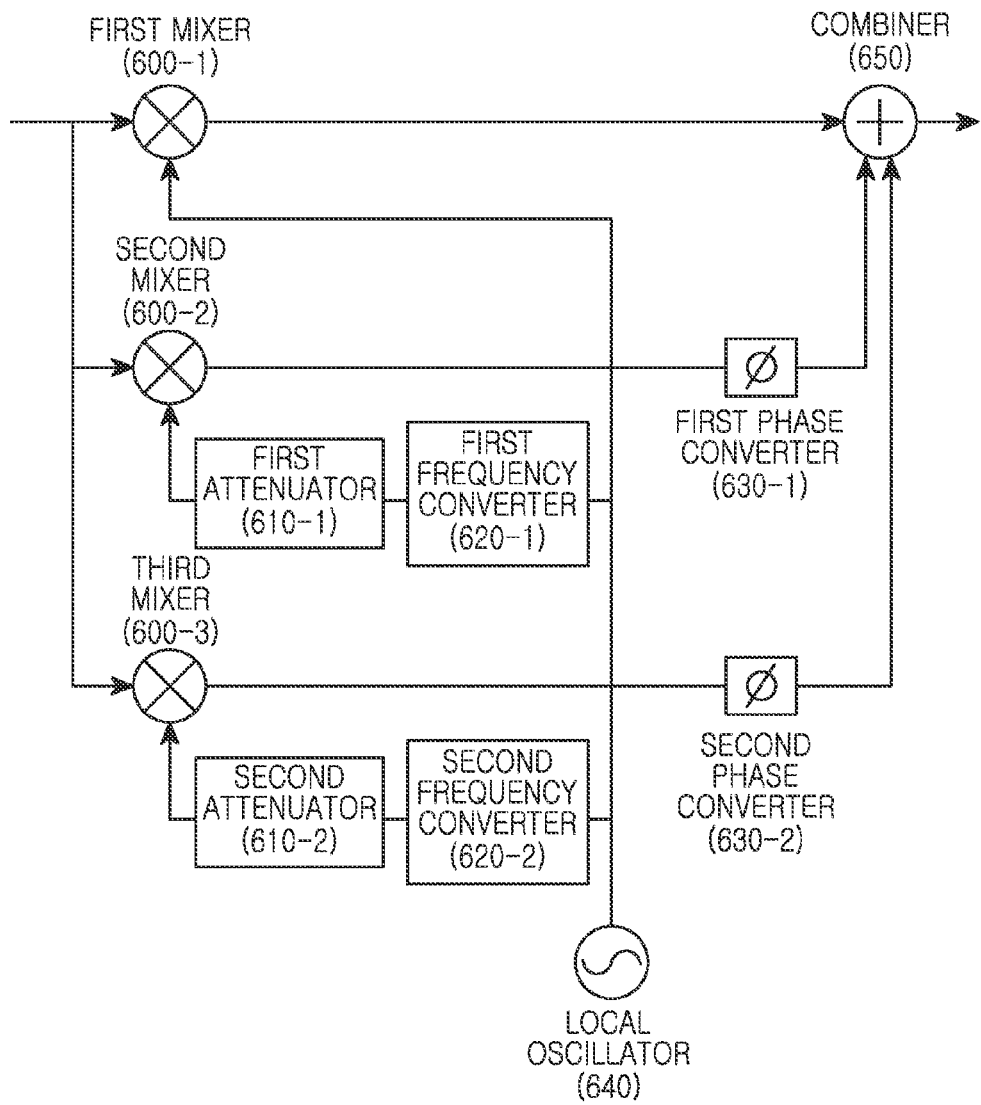
FIG. 6 is a block diagram of an HRM according to still another exemplary embodiment of the present invention.

FIG. 6 is a block diagram of an HRM according to still another exemplary embodiment of the present invention.

As illustrated in FIG. 6, the HRM includes mixers 600-1, 600-2, 600-3, attenuators 610-1, 610-2, frequency converters 620-1, 620-2, phase converters 630-1, 630-2, an LO 640, and a combiner 650.

The LO 640 generates an LO signal in order to down-convert input signals of the mixers 600-1, 600-2, 600-3.

The first mixer 600-1 down-converts an input signal using an LO signal generated by the LO 640.

The first frequency converter 620-1 multiplies three times an LO signal generated by the LO 640 in order to generate a frequency three times-greater than a basic frequency.

The first attenuator 610-1 controls the magnitude of an LO signal multiplied by the first frequency converter 620-1 so that the magnitude of an output signal of the second mixer 600-2 may be the same as the magnitude of a harmonic component included in an output signal of the first mixer 600-1.

The second mixer 600-2 down-converts an input signal using an LO signal whose magnitude has been controlled by the first attenuator 610-1.

In the case where the combiner 650 combines signals, the first phase converter 630-1 changes the phase of an output signal of the second mixer 600-2 so that the output signal of the second mixer 600-2 may be removed from an output signal of the first mixer 600-1.

The second frequency converter 620-2 multiplies five times an LO signal generated by the LO 640 in order to generate a frequency five times-greater than the basic frequency.

The second attenuator 610-2 controls the magnitude of an LO signal multiplied by the second frequency converter 620-2 so that the magnitude of an output signal of the third mixer 600-3 may be the same as the magnitude of a harmonic component included in an output signal of the first mixer 600-1.

The third mixer 600-3 down-converts an input signal using an LO signal multiplied by the second frequency converter 620-2.

In the case where the combiner 650 combines signals, the second phase converter 630-2 changes the phase of an output signal of the third mixer 600-3 so that the output signal of the third mixer 600-3 may be removed from an output signal of the first mixer 600-1.

The combiner 650 combines an output signal of the first mixer 600-1 with signals provided from the first phase converter 630-1 and the second phase converter 630-2 to output a harmonic component-removed signal.

Figure 7:
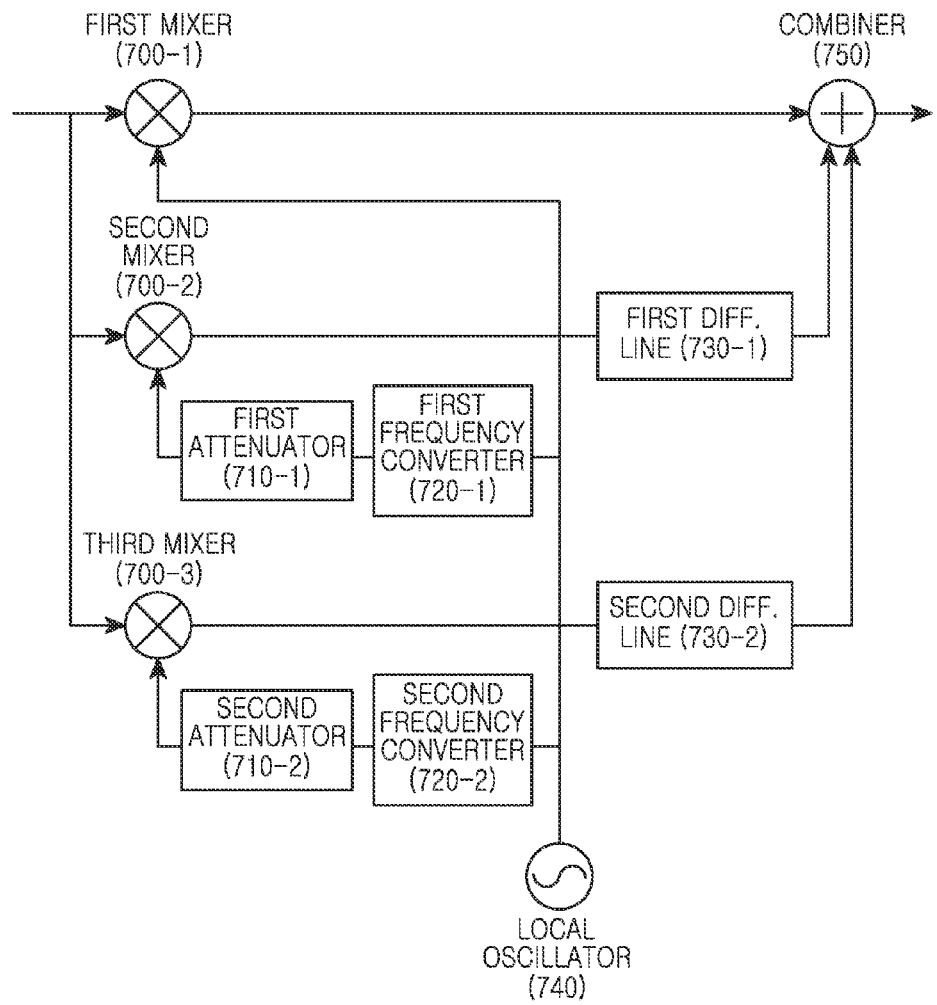
FIG. 7 is a block diagram of an HRM according to still yet another exemplary embodiment of the present invention.

FIG. 7 is a block diagram of an HRM according to still yet another exemplary embodiment of the present invention.

As illustrated in FIG. 7, the HRM includes mixers 700-1, 700-2, 700-3, attenuators 710-1, 710-2, frequency converters 720-1, 720-2, converting lines 730-1, 730-2, an LO 740, and a combiner 750.

The LO 740 generates an LO signal in order to down-convert input signals of the mixers 700-1, 700-2, 700-3.

The first mixer 700-1 down-converts an input signal using an LO signal generated by the LO 740.

The first frequency converter 720-1 multiplies three times an LO signal generated by the LO 740 in order to generate a frequency three times-greater than a basic frequency.

The first attenuator 710-1 controls the magnitude of an LO signal multiplied by the first frequency converter 720-1 so that the magnitude of an output signal of the second mixer 700-2 may be the same as the magnitude of a harmonic component included in an output signal of the first mixer 700-1.

The second mixer 700-2 down-converts an input signal using an LO signal whose magnitude has been controlled by the first attenuator 710-1.

The first converting line 730-1 changes the phase of a signal provided from the second mixer 700-2 by 180 degree. For example, the first converting line 730-1 changes the sign of a signal provided from the second mixer 700-2.

The second frequency converter 720-2 multiplies five times an LO signal generated by the LO 740 in order to generate a frequency five times-greater than the basic frequency.

The second attenuator 710-2 controls the magnitude of an LO signal multiplied by the second frequency converter 720-2 so that the magnitude of an output signal of the third mixer 700-3 may the same as the magnitude of a harmonic component included in an output signal of the first mixer 700-1.

The third mixer 700-3 down-converts an input signal using an LO signal multiplied by the second frequency converter 720-2.

The second converting line 730-2 changes the phase of a signal provided from the third mixer 700-3 by 180 degree. For example, the second converting line 730-2 changes the sign of a signal provided from the third mixer 700-3.

The combiner 750 combines an output signal of the first mixer 700-1 with signals provided from the first converting line 730-1 and the second converting line 730-2 to output a harmonic component-removed signal.

Figure 8:
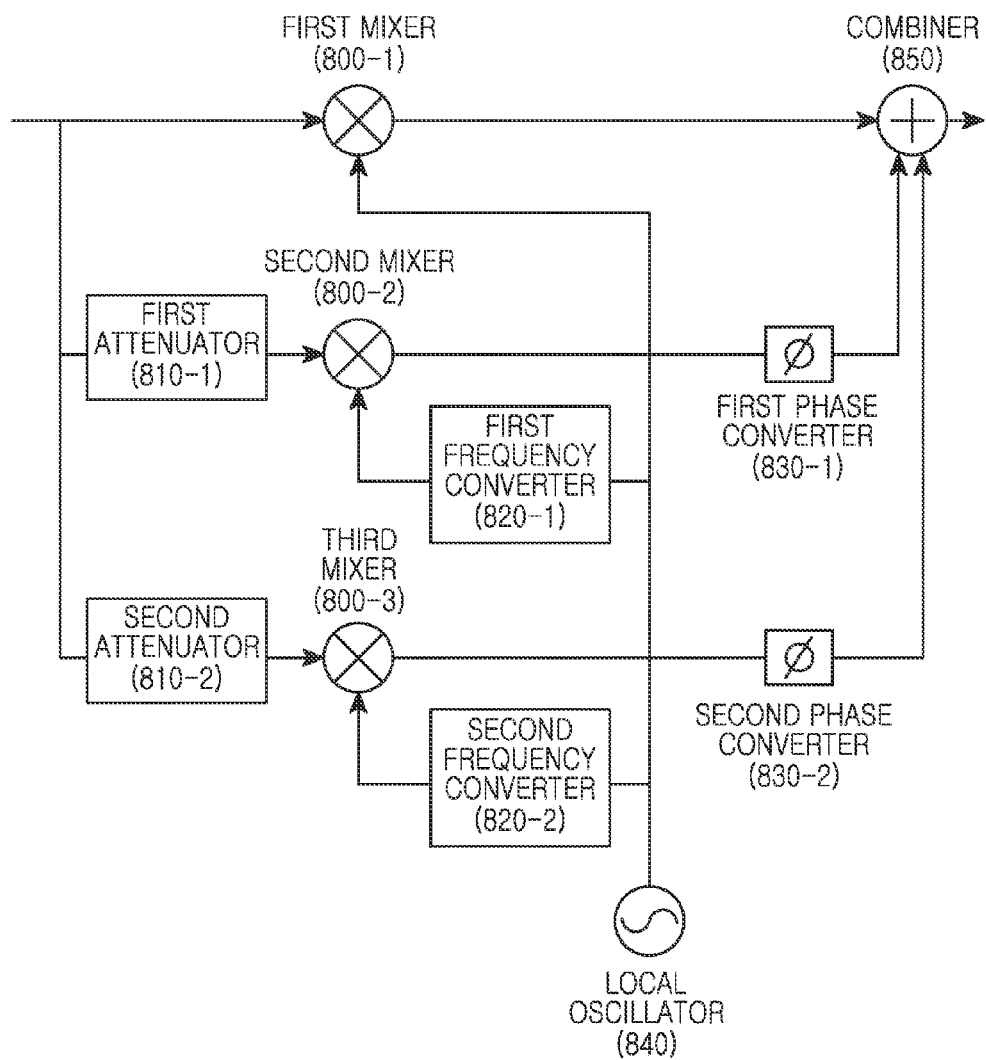
FIG. 8 is a block diagram of an HRM according to a further still another exemplary embodiment of the present invention.

FIG. 8 is a block diagram of an HRM according to a further still another exemplary embodiment of the present invention.

As illustrated in FIG. 8, the HRM includes mixers 800-1, 800-2, 800-3, attenuators 810-1, 810-2, frequency converters 820-1, 820-2, phase converters 830-1, 830-2, an LO 840, and a combiner 850.

The LO 840 generates an LO signal in order to down-convert input signals of the mixers 800-1, 800-2, 800-3.

The first mixer 800-1 down-converts an input signal using an LO signal generated by the LO 840.

The first frequency converter 820-1 multiplies three times an LO signal generated by the LO 840 in order to generate a frequency three times-greater than a basic frequency.

The first attenuator 810-1 controls the magnitude of a signal input to the second mixer 800-2 so that the magnitude of an output signal of the second mixer 800-2 may be the same as the magnitude of a harmonic component included in an output signal of the first mixer 800-1.

The second mixer 800-2 down-converts a magnitude-controlled input signal provided from the first attenuator 810-1 using an LO signal multiplied by the first frequency converter 820-1.

In the case where the combiner 850 combines signals, the first phase converter 830-1 changes the phase of an output signal of the second mixer 800-2 so that the output signal of the second mixer 800-2 may be removed from an output signal of the first mixer 800-1.

The second frequency converter 820-2 multiplies five times an LO signal generated by the LO 840 in order to generate a frequency five times-greater than the basic frequency.

The second attenuator 810-2 controls the magnitude of a signal input to the third mixer 800-3 so that the magnitude of an output signal of the third mixer 800-3 may the same as the magnitude of a harmonic component included in an output signal of the first mixer 800-1.

The third mixer 800-3 down-converts a magnitude-controlled input signal provided from the second attenuator 810-2 using an LO signal multiplied by the second frequency converter 820-2.

In the case where the combiner 850 combines signals, the second phase converter 830-2 changes the phase of an output signal of the third mixer 800-3 so that the output signal of the third mixer 800-3 may be removed from an output signal of the first mixer 800-1.

The combiner 850 combines an output signal of the first mixer 800-1 with signals provided from the first phase converter 830-1 and the second phase converter 830-2 to output a harmonic component-removed signal.

Figure 9:
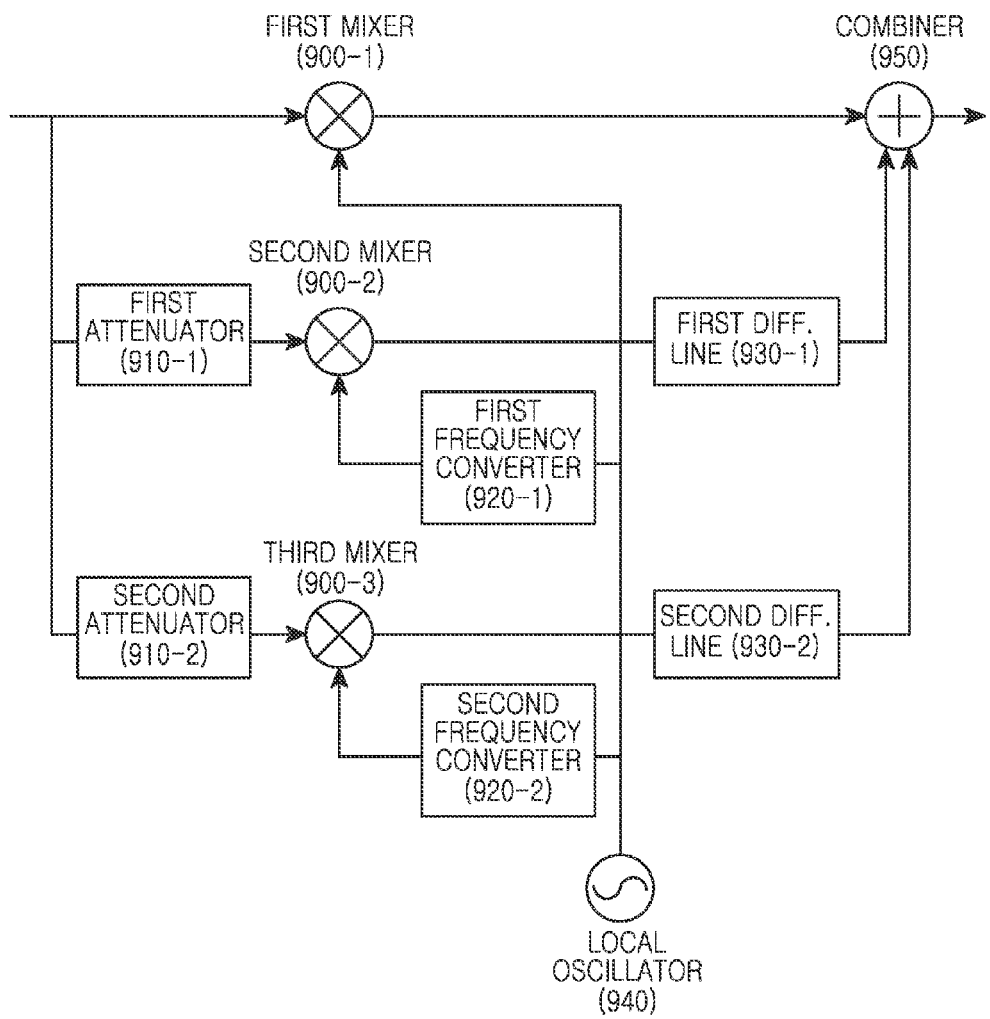
FIG. 9 is a block diagram of an HRM according to a further yet another exemplary embodiment of the present invention.

FIG. 9 is a block diagram of an HRM according to a further yet another exemplary embodiment of the present invention.

As illustrated in FIG. 9, the HRM includes mixers 900-1, 900-2, 900-3, attenuators 910-1, 910-2, frequency converters 920-1, 920-2, converting lines 930-1, 930-2, an LO 940, and a combiner 950.

The LO 940 generates an LO signal in order to down-convert input signals of the mixers 900-1, 900-2, 900-3.

The first mixer 900-1 down-converts an input signal using an LO signal generated by the LO 940.

The first frequency converter 920-1 multiplies three times an LO signal generated by the LO 940 in order to generate a frequency three times-greater than a basic frequency.

The first attenuator 910-1 controls the magnitude of a signal input to the second mixer 900-2 so that the magnitude of an output signal of the second mixer 900-2 may be the same as the magnitude of a harmonic component included in an output signal of the first mixer 900-1.

The second mixer 900-2 down-converts a magnitude-controlled input signal provided from the first attenuator 910-1 using an LO signal multiplied by the first frequency converter 920-1.

The first converting line 930-1 changes the phase of a signal provided from the second mixer 900-2 by 180 degree. For example, the first converting line 930-1 changes the sign of a signal provided from the second mixer 900-2.

The second frequency converter 920-2 multiplies five times an LO signal generated by the LO 940 in order to generate a frequency five times-greater than the basic frequency.

The second attenuator 910-2 controls the magnitude of a signal input to the third mixer 900-3 so that the magnitude of an output signal of the third mixer 900-3 may the same as the magnitude of a harmonic component included in an output signal of the first mixer 900-1.

The third mixer 900-3 down-converts a magnitude-controlled input signal provided from the second attenuator 910-2 using an LO signal multiplied by the second frequency converter 920-2.

The second converting line 930-2 changes the phase of a signal provided from the third mixer 900-3 by 180 degree. For example, the second converting line 930-2 changes the sign of a signal provided from the third mixer 900-3.

The combiner 950 combines an output signal of the first mixer 900-1 with signals provided from the first converting line 930-1 and the second converting line 930-2 to output a harmonic component-removed signal.

Hereinafter, a method for removing harmonic components using a plurality of frequency LO signals is described. The following description is made on the assumption that an HRM is configured as illustrated in FIG. 2. However, in the case where the HRM is configured as illustrated in FIGS. 3 to 9, only a portion for controlling the magnitude of a signal in order to remove a harmonic component and a portion for controlling the phase of output signals of the second mixer and the third mixer are different, and a basic operation for removing a harmonic component using a plurality of frequency LO signals is the same.

Figure 10:
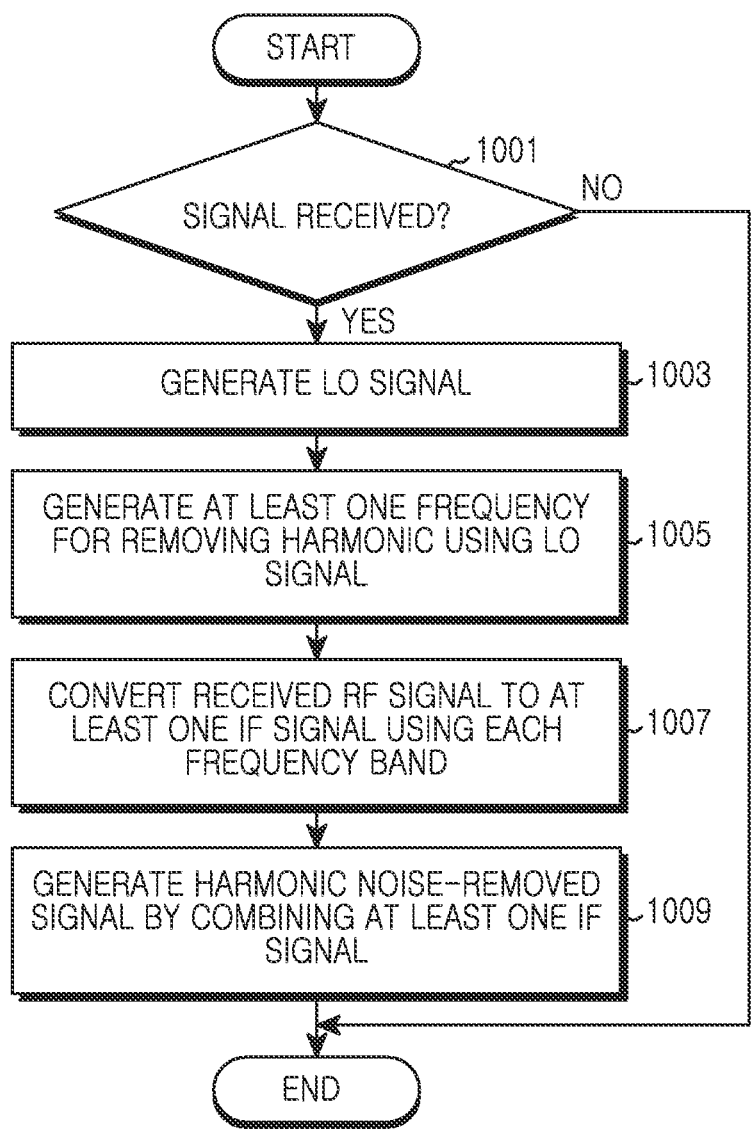
FIG. 10 is a flowchart illustrating a procedure for removing a harmonic in an HRM according to an exemplary embodiment of the present invention.

FIG. 10 illustrates a procedure for removing a harmonic in an HRM according to an exemplary embodiment of the present invention.

Referring to FIG. 10, the HRM determines whether a signal to down-convert exists in step 1001. That is, the HRM determines whether a signal received by a reception end exists.

When the signal received by the reception end does not exist, the HRM recognizes that a signal to down-convert does not exist. Accordingly, the HRM ends the present algorithm.

In contrast, when the signal received by the reception end exists, the HRM recognizes that a signal to down-convert exists. Accordingly, the HRM proceeds to step 1003 to generate an LO signal.

After that, the HRM proceeds to step 1005 to generate a frequency to be provided to respective mixers included in the HRM. For example, the HRM multiplies odd-number times an LO signal to be provided to the respective mixers using the frequency converter illustrated in FIGS. 2 to 9.

After generating a frequency to be provided to the respective mixers, the HRM proceeds to step 1007 to convert the received RF signal to an IF signal using the generated frequency at each mixer.

After generating the IF signal, the HRM proceeds to step 1009 to generate a harmonic component-removed signal by combining the generated IF signal. For example, the HRM controls the magnitude and the phase of a signal down-converted by the second mixer 200-2 and the third mixer 200-3 using the attenuators 210-1, 210-2, and the phase converters 230-1, 230-2 as illustrated in FIG. 2. After that, the HRM combines an output signal of the first mixer 200-1 with signals provided from the first phase converter 230-1 and the second phase converter 230-2.

After that, the HRM ends the present algorithm.

As described above, the HRM may set differently a frequency band to be used for down-converting a signal at respective mixers to remove a harmonic component.

Hereinafter, a technology for controlling the power of an HRM by controlling an operating mode of a mixer depending on a harmonic component included in an RF signal in the HRM. The following description is made on the assumption that the power of an HRM configured as in FIG. 2 is controlled. However, the power control configuration may be added to an HRM configured as in FIGS. 3 to 9.

Figure 11:
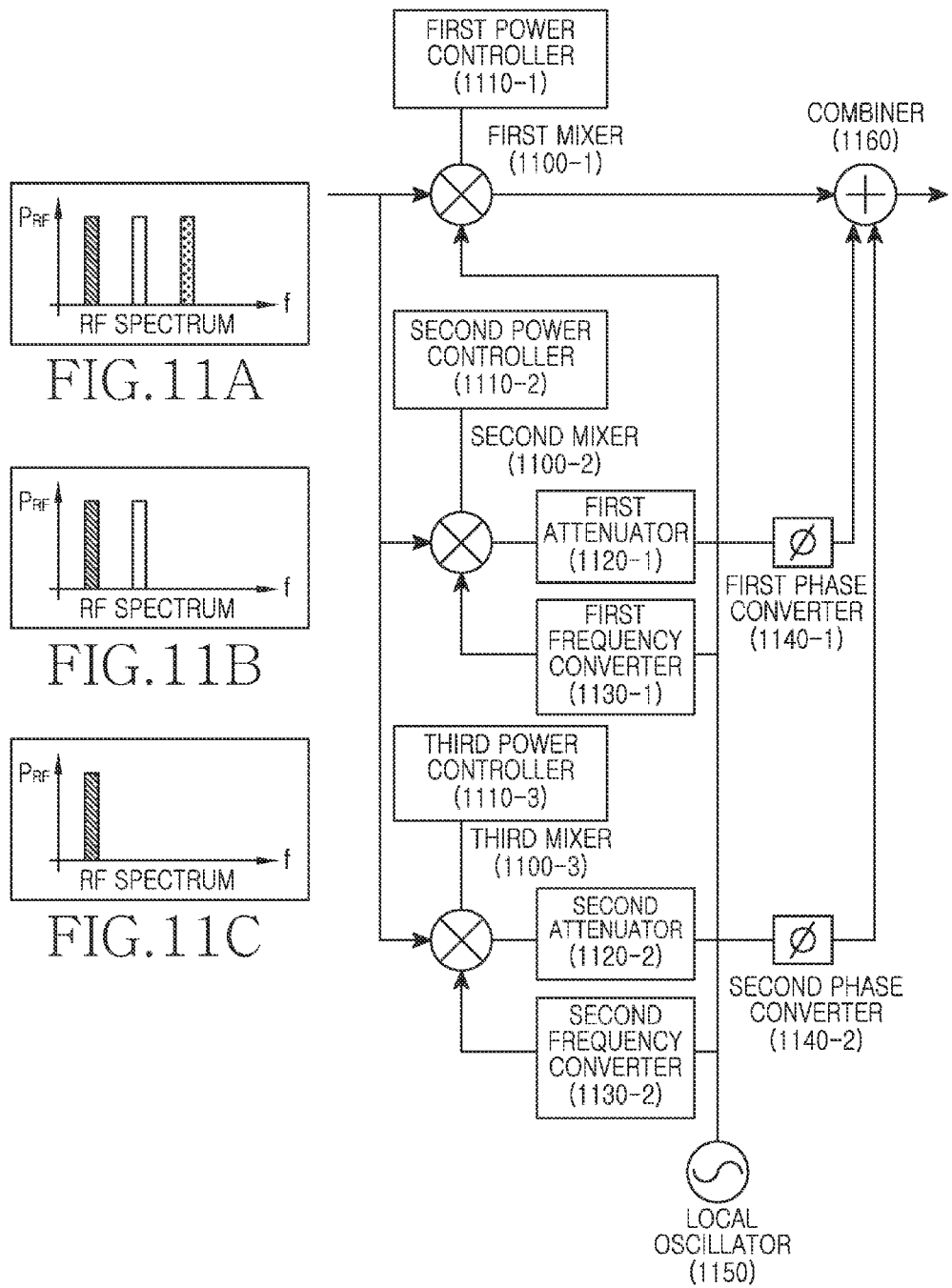
FIGS. 11A-11C are block diagrams illustrating a construction for controlling power in an HRM according to an exemplary embodiment of the present invention.

FIGS. 11A-11C are block diagrams illustrating a construction for controlling power in an HRM according to an exemplary embodiment of the present invention.

As illustrated in FIGS. 11A-11C, the HRM includes mixers 1100-1, 1100-2, 1100-3, power controllers 1110-1, 1110-2, 1110-3, attenuators 1120-1, 1120-2, frequency converters 1130-1, 1130-2, phase converters 1140-1, 1140-2, an LO 1150, and a combiner 1160.

The power controllers 1110-1, 1110-2, 1110-3 determine whether to drive the respective mixers 1100-1, 1100-2, 1100-3 depending on a harmonic component of an RF signal input to the HRM. For example, as illustrated in FIG. 11A, in the case where an RF signal including first order, third order, and fifth order harmonic components is input, the power controllers 1110-1, 1110-2, 1110-3 control to drive the respective mixers 1100-1, 1100-2, 1100-3. For another example, as illustrated in FIG. 11B, in the case where an RF signal including first order and third order harmonic components is input, the first power controller 1110-1 and the second power controller 1110-2 control to drive the first mixer 1100-1 and the second mixer 1100-2, and the third power controller 1110-3 controls not to drive the third mixer 1100-3. For still another example, as illustrated in FIG. 11C, in the case where an RF signal including a first order harmonic component is input, the first power controller 1110-1 controls to drive the first mixer 1100-1, and the second power controller 1110-2 and the third power controller 1110-3 control not to drive the second mixer 1100-2 and the third mixer 1100-3.

The LO 1150 generates an LO signal for down-converting input signals of the mixers 1100-1, 1100-2, 1100-3.

When driven under control of the first power controller 1110-1, the first mixer 1100-1 down-converts an input signal using an LO signal generated by the LO 1150.

The first frequency converter 1130-1 multiplies three times an LO signal generated by the LO 1150 in order to generate a frequency three times-greater than a basic frequency.

When driven under control of the second power controller 1110-2, the second mixer 1100-2 down-converts an input signal using an LO signal multiplied by the first frequency converter 1130-1.

The first attenuator 1120-1 controls the magnitude of an output signal of the second mixer 1100-2 so that the magnitude of an output signal of the second mixer 1100-2 may be the same as the magnitude of a harmonic component included in an output signal of the first mixer 1100-1.

In the case where the combiner 1160 combines signals, the first phase converter 1140-1 changes the phase of a signal provided from the first attenuator 1120-1 so that the signal provided from the first attenuator 1120-1 may be removed from an output signal of the first mixer 1100-1.

The second frequency converter 1130-2 multiplies five times an LO signal generated by the LO 1150 in order to generate a frequency five times-greater than the basic frequency.

When driven under control of the third power controller 1110-3, the third mixer 1100-3 down-converts an input signal using an LO signal multiplied by the second frequency converter 1130-2.

The second attenuator 1120-2 controls the magnitude of an output signal of the third mixer 1100-3 so that the magnitude of an output signal of the third mixer 1100-3 may the same as the magnitude of a harmonic component included in an output signal of the first mixer 1100-1.

In the case where the combiner 1160 combines signals, the second phase converter 1140-2 changes the phase of a signal provided from the second attenuator 1120-2 so that the signal provided from the second attenuator 1120-2 may be removed from an output signal of the first mixer 1100-1.

The combiner 1160 combines an output signal of the first mixer 1100-1 with signals provided from the first phase converter 1140-1 and the second phase converter 1140-2 to output a harmonic component-removed signal.

In the above embodiment, the HRM controls driving of the mixer depending on a harmonic component of an input RF signal. In another embodiment, the HRM may control driving of at least one of the frequency converter, the attenuator, and the phase converter related to the relevant mixer together as well as the mixer depending on a harmonic component of an input RF signal.

Figure 12:
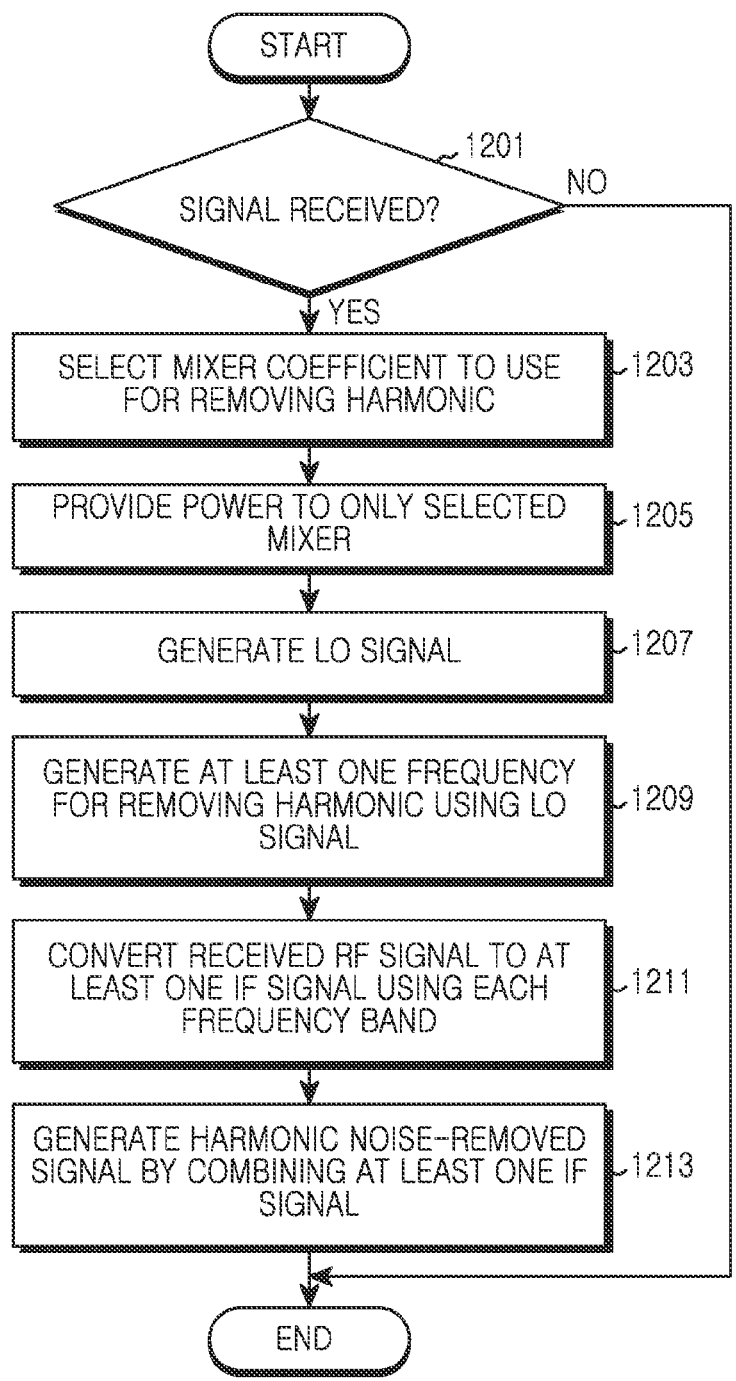
FIG. 12 is a flowchart illustrating a procedure for controlling power in an HRM according to an exemplary embodiment of the present invention.

FIG. 12 is a flowchart illustrating a procedure for controlling power in an HRM according to an exemplary embodiment of the present invention.

Referring to FIG. 12, the HRM determines whether a signal to down-convert exists in step 1201. That is, the HRM determines whether a signal received by a reception end exists.

When the signal received by the reception end does not exist, the HRM recognizes that a signal to down-convert does not exist. Accordingly, the HRM ends the present algorithm.

In contrast, when the signal received by the reception end exists, the HRM recognizes that a signal to down-convert exists. Accordingly, the HRM proceeds to step 1203 to select a mixer to drive depending on a harmonic component of an RF signal input to the HRM. For example, in the case where an RF signal including first order, third order, and fifth order harmonic components is input as illustrated in FIG. 11A, the HRM selects to drive the mixers 1100-1, 1100-2, 1100-3. For another example, in the case where an RF signal including first order and third order harmonic components is input as illustrated in FIG. 11B, the HRM selects to drive the first mixer 1100-1 and the second mixer 1100-2. For still another example, in the case where an RF signal including a first order harmonic component is input as illustrated in FIG. 11C, the HRM selects to drive only the first mixer 1100-1.

After selecting at least one mixer to drive, the HRM proceeds to step 1205 to provide power to only the selected at least one mixer.

After that, the HRM proceeds to step 1207 to generate an LO signal.

After generating the LO signal, the HRM proceeds to step 1209 to generate a frequency to be provided to at least one mixer that is driven by provided power. For example, the HRM multiplies odd number-times an LO signal to be provided to at least one mixer driven using the frequency converter illustrated in FIGS. 11A-11C.

After generating the frequency to be provided to the driven at least one mixer, the HRM proceeds to step 1211 to convert the RF signal received by the relevant mixer to an IF signal using the generated frequency.

After generating the IF signal, the HRM proceeds to step 1213 to combine the generated IF signal to generate a harmonic component-removed signal. For example, in case of driving the first mixer 1100-1, the second mixer 1100-2, and the third mixer 1100-3 in FIGS. 11A-11C, the HRM controls the magnitude and the phase of a signal down-converted by the second mixer 1100-2 and the third mixer 1100-3 using the attenuators 1120-1, 1120-2, and the phase converters 1140-1, 1140-2. After that, the HRM combines an output signal of the first mixer 1100-1 with signals provided from the first phase converter 1140-1 and the second phase converter 1140-2 using the combiner 1160.

After that, the HRM ends the present algorithm.

Hereinafter, a construction for calibrating output signals of respective mixers forming an HRM is described. The following description assumes that an HRM configured as in FIG. 2 calibrates output signals of respective mixers. However, the configuration for calibrating output signals of respective mixers may be added to an HRM configured as in FIGS. 3 to 9, and 11.

Figure 13:
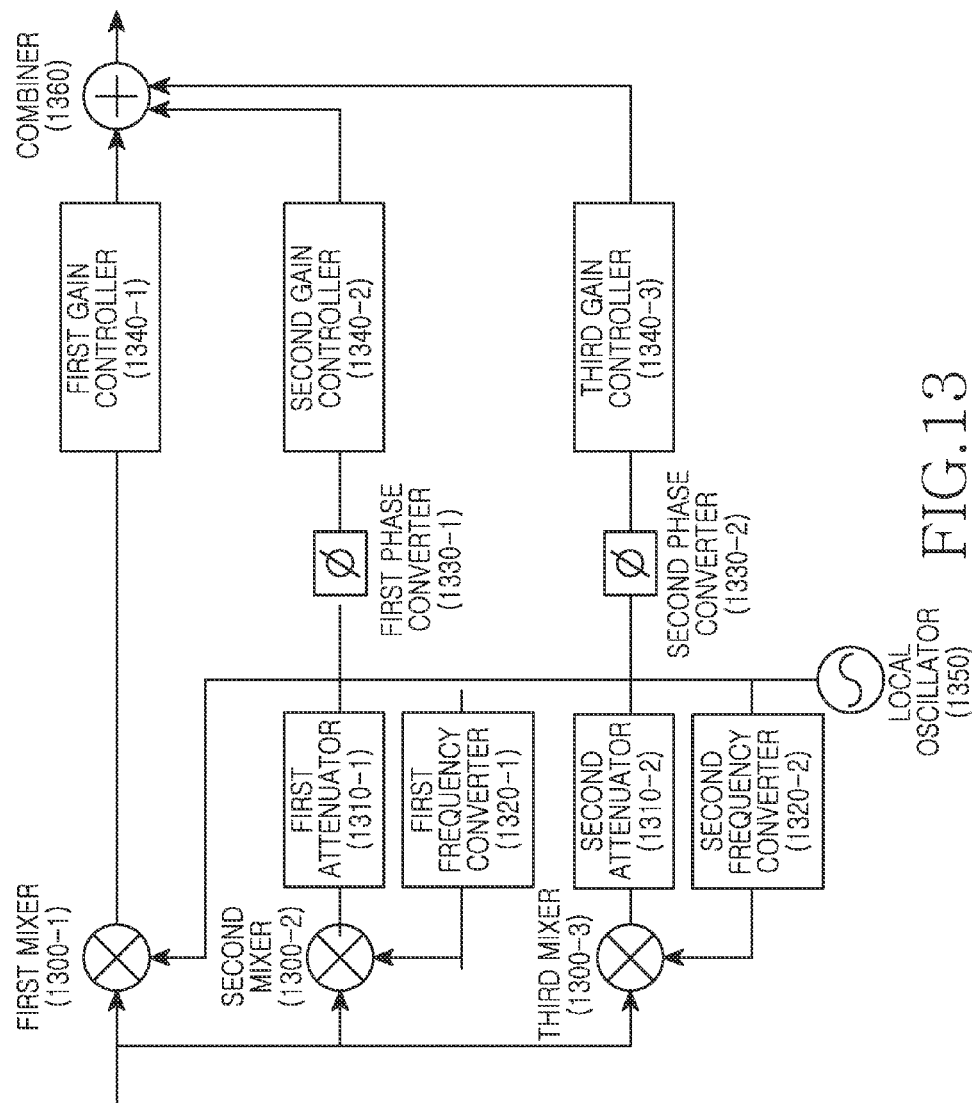
FIG. 13 is a block diagram illustrating a construction for calibrating an output signal of an HRM according to an exemplary embodiment of the present invention.

FIG. 13 is a block diagram illustrating a construction for calibrating an output signal of an HRM according to an exemplary embodiment of the present invention.

As illustrated in FIG. 13, the HRM includes mixers 1300-1, 1300-2, 1300-3, attenuators 1310-1, 1310-2, frequency converters 1320-1, 1320-2, phase converters 1330-1, 1330-2, gain controllers 1340-1, 1340-2, 1340-3, an LO 1350, and a combiner 1360.

The LO 1350 generates an LO signal in order to down-convert input signals of the mixers 1300-1, 1300-2, 1300-3.

The first mixer 1300-1 down-converts an input signal using an LO signal generated by the LO 1350.

The first gain controller 1340-1 closely controls the intensity of an output signal of the first mixer 1300-1 in order to compensate for a mechanical error of the first mixer 1300-1.

The first frequency converter 1320-1 multiplies three times an LO signal generated by the LO 1350 in order to generate a frequency three times-greater than a basic frequency.

The second mixer 1300-2 down-converts an input signal using an LO signal multiplied by the first frequency converter 1320-1.

The first attenuator 1310-1 controls the magnitude of an output signal of the second mixer 1300-2 so that the magnitude of an output signal of the second mixer 1300-2 may be the same as the magnitude of a harmonic component included in an output signal of the first mixer 1300-1.

In the case where the combiner 1360 combines signals, the first phase converter 1330-1 changes the phase of a signal provided from the first attenuator 1310-1 so that the signal provided from the first attenuator 1310-1 may be removed from an output signal of the first mixer 1300-1.

The second gain controller 1340-2 closely controls the intensity of an output signal of the first phase converter 1330-1 in order to compensate for a mechanical error of the second mixer 1300-2.

The second frequency converter 1320-2 multiplies five times an LO signal generated by the LO 1350 in order to generate a frequency five times-greater than the basic frequency.

The third mixer 1300-3 down-converts an input signal using an LO signal multiplied by the second frequency converter 1320-2.

The second attenuator 1310-2 controls the magnitude of an output signal of the third mixer 1300-3 so that the magnitude of an output signal of the third mixer 1300-3 may be the same as the magnitude of a harmonic component included in an output signal of the first mixer 1300-1.

In the case where the combiner 1360 combines signals, the second phase converter 1330-2 changes the phase of a signal provided from the second attenuator 1310-2 so that the signal provided from the second attenuator 1310-2 may be removed from an output signal of the first mixer 1300-1.

The third gain controller 1340-3 closely controls the intensity of an output signal of the second phase converter 1330-2 in order to compensate for a mechanical error of the third mixer 1300-3.

The combiner 1360 combines an output signal of the first gain controller 1340-1 with signals of the second gain controller 1340-2 and the third gain controller 1340-3 to output a harmonic component-removed signal.

In the above embodiment, the HRM compensates for a mechanical error of a relevant mixer through calibration of output signals of respective mixers.

Figure 14:
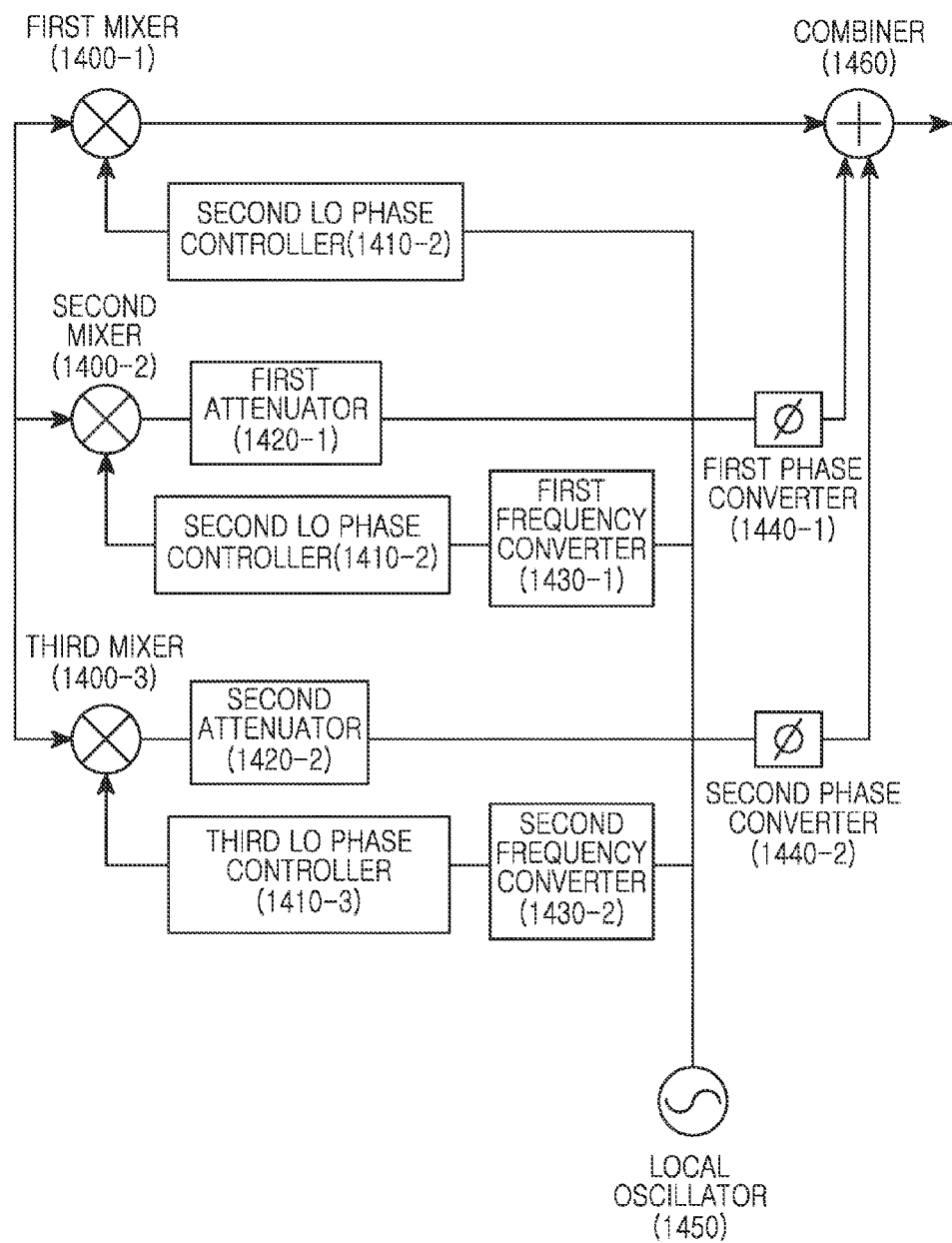
FIG. 14 is a block diagram illustrating a construction for calibration in an HRM according to an exemplary embodiment of the present invention.

In another embodiment, the HRM may calibrate the phase of LO signals of respective mixers as illustrated in FIG. 14. The following description is made on the assumption that the HRM configured as in FIG. 2 calibrates the phase of LO signals of respective mixers. However, the configuration for calibrating LO signals of respective mixers may be added to an HRM configured as in FIGS. 3 to 9, and 11.

FIG. 14 is a block diagram illustrating a construction for calibration in an HRM according to an exemplary embodiment of the present invention.

As illustrated in FIG. 14, the HRM includes mixers 1400-1, 1400-2, 1400-3, phase controllers 1410-1, 1410-2, 1410-3, attenuators 1420-1, 1420-2, frequency converters 1430-1, 1430-2, phase converters 1440-1, 1440-2, an LO 1450, and a combiner 1460.

The LO 1450 generates an LO signal in order to down-convert input signals of the mixers 1400-1, 1400-2, 1400-3.

The first phase controller 1410-1 controls a phase change of the LO signal depending on a signal delay time between the LO 1450 and the first mixer 1400-1. For example, in the case where a small number of delay cells exist between the LO 1450 and the first mixer 1400-1, a delay time by transmission of the LO signal becomes small, so that the phase of the LO signal precedes the phase of LO signals transmitted to other mixers 1400-2, 1400-3 via different paths. Accordingly, the first phase controller 1410-1 controls the phase of the LO signal for the first mixer 1400-1 so that the phase of the LO signal for the first mixer 1400-1 may be the same as the phase of the LO signals of the other mixers 1400-2, 1400-3. For another example, in the case where a large number of delay cells exist between the LO 1450 and the first mixer 1400-1, a delay time by transmission of the LO signal becomes large, so that the phase of the LO signal lags behind the phase of LO signals transmitted to other mixers 1400-2, 1400-3 via different paths. Accordingly, the first phase controller 1410-1 controls the phase of the LO signal for the first mixer 1400-1 so that the phase of the LO signal for the first mixer 1400-1 may be the same as the phase of the LO signals of the other mixers 1400-2, 1400-3.

The first mixer 1400-1 down-converts an input signal using an LO signal provided from the first phase controller 1410-1.

The first frequency converter 1430-1 multiplies three times an LO signal generated by the LO 1450 in order to generate a frequency three times-greater than a basic frequency.

The second phase controller 1410-2 controls a phase change of an LO signal multiplied by the first frequency converter 1430-1 depending on a signal delay time between the LO 1450 and the second mixer 1400-2.

The second mixer 1400-2 down-converts an input signal using an LO signal provided from the second phase controller 1410-2.

The first attenuator 1420-1 controls the magnitude of an output signal of the second mixer 1400-2 so that the magnitude of an output signal of the second mixer 1400-2 may be the same as the magnitude of a harmonic component included in an output signal of the first mixer 1400-1.

In the case where the combiner 1460 combines signals, the first phase converter 1440-1 changes the phase of a signal provided from the first attenuator 1420-1 so that the signal provided from the first attenuator 1420-1 may be removed from an output signal of the first mixer 1400-1.

The second frequency converter 1430-2 multiplies five times an LO signal generated by the LO 1450 in order to generate a frequency five times-greater than the basic frequency.

The third phase controller 1410-3 controls a phase change of an LO signal multiplied by the second frequency converter 1430-2 depending on a signal delay time between the LO 1450 and the third mixer 1400-3.

The third mixer 1400-3 down-converts an input signal using an LO signal provided from the third phase controller 1410-3.

The second attenuator 1420-2 controls the magnitude of an output signal of the third mixer 1400-3 so that the magnitude of an output signal of the third mixer 1400-3 may be the same as the magnitude of a harmonic component included in an output signal of the first mixer 1400-1.

In the case where the combiner 1460 combines signals, the second phase converter 1440-2 changes the phase of a signal provided from the second attenuator 1420-2 so that the signal provided from the second attenuator 1420-2 may be removed from an output signal of the first mixer 1400-1.

The combiner 1460 combines an output signal of the first mixer 1400-1 with signals provided from the first phase converter 1440-1 and the second phase converter 1440-2 to output a harmonic component-removed signal.

Figure 15:
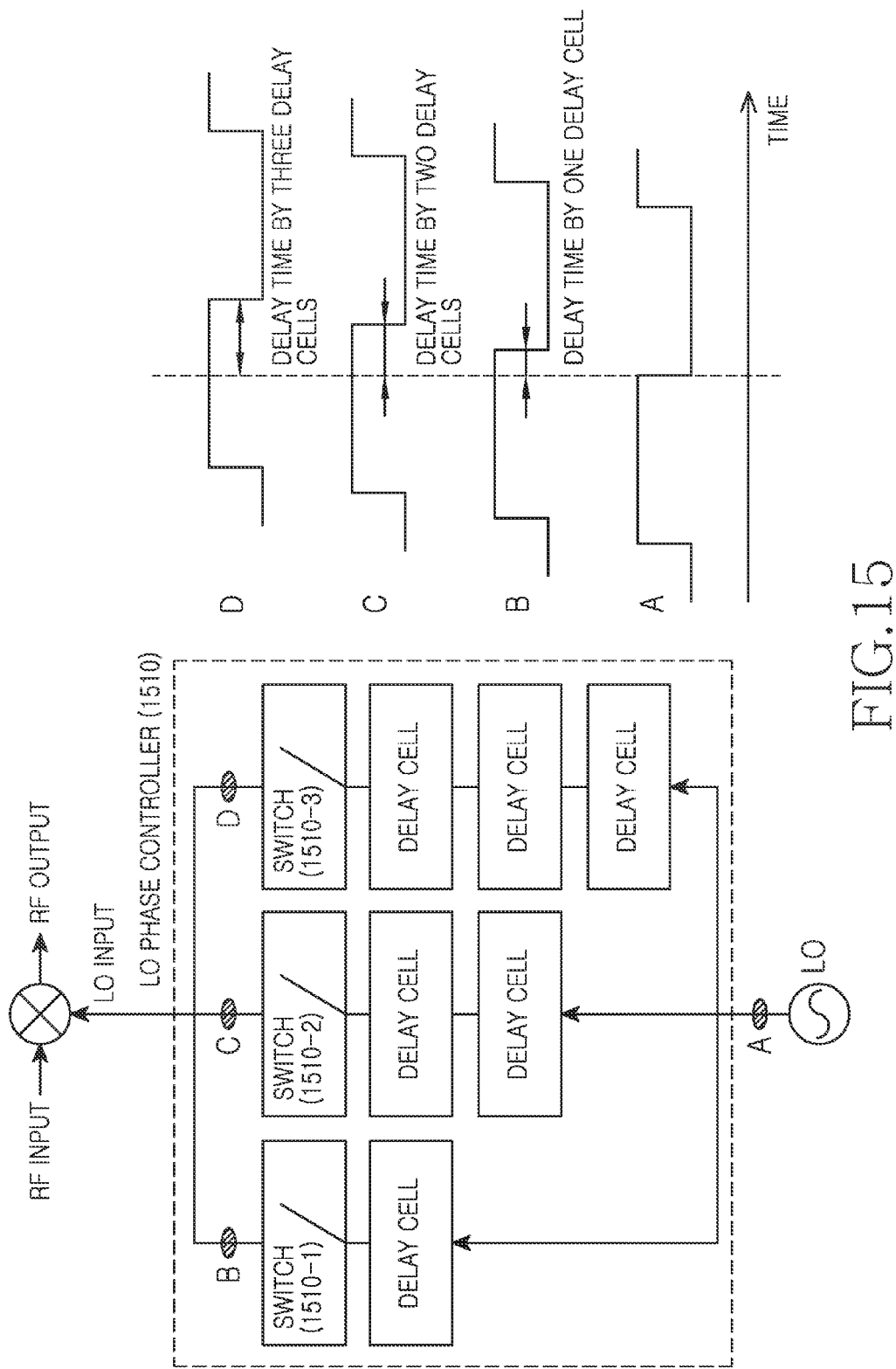
FIG. 15 is a view illustrating a construction for controlling a phase of an LO signal according to an exemplary embodiment of the present invention.

In the above-described HRM, the phase controllers 1410-1, 1410-2, 1410-3 for controlling the phase of an LO signal may be configured as illustrated in FIG. 15.

FIG. 15 illustrates a construction for controlling a phase of an LO signal according to an exemplary embodiment of the present invention.

As illustrated in FIG. 15, each of the phase controllers 1410-1, 1410-2, 1410-3 includes at least one path including a different number of delay cells.

For example, each of the phase controllers 1410-1, 1410-2, 1410-3 includes a first path 1500-1 including one delay cell, a second path 1500-2 including two delay cells, and a third path 1500-3 including three delay cells.

The phase controllers 1410-1, 1410-2, 1410-3 select a path for providing an LO signal to a relevant mixer with consideration of a delay time between the LO 1450 and the mixers 1400-1, 1400-2, 1400-3. For example, in the case where a delay time between the LO 1450 and the first mixer 1400-1 precedes delay times of the other mixers 1400-2, 1400-3, the first phase controller 1410-1 selects the second path 1500-2 or the third path 1500-3 as a path to which an LO signal is to be provided depending on a degree by which the delay time of the first mixer 1400-1 precedes the delay times of the other mixers 1400-2, 1400-3.

Figure 16:
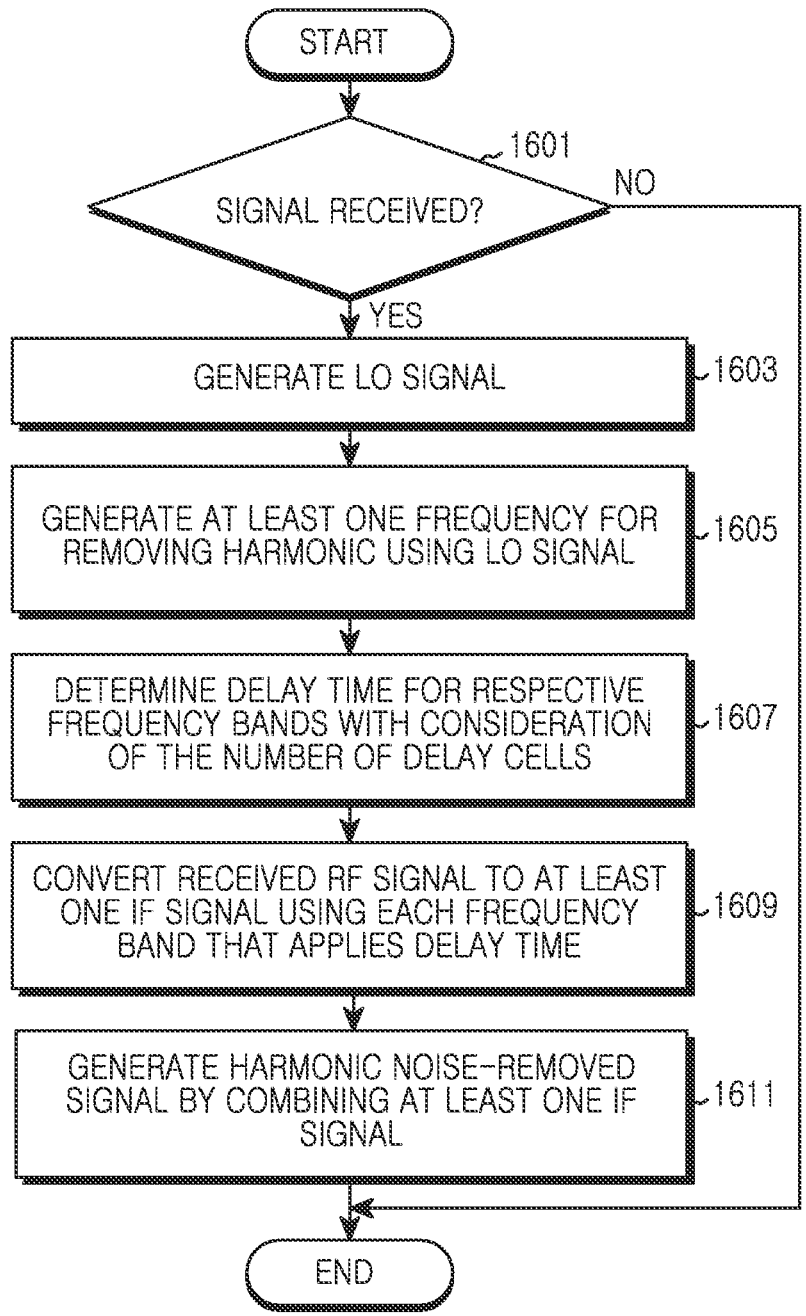
FIG. 16 is a flowchart illustrating a procedure for calibration in an HRM according to an exemplary embodiment of the present invention.

FIG. 16 is a flowchart illustrating a procedure for calibration in an HRM according to an exemplary embodiment of the present invention.

Referring to FIG. 16, the HRM determines whether a signal to down-convert exists in step 1601. That is, the HRM determines whether a signal received by a reception end exists.

When the signal received by the reception end does not exist, the HRM recognizes that a signal to down-convert does not exist. Accordingly, the HRM ends the present algorithm.

In contrast, when the signal received by the reception end exists, the HRM recognizes that a signal to down-convert exists. Accordingly, the HRM proceeds to step 1603 to generate an LO signal.

After that, the HRM proceeds to step 1605 to generate a frequency to be provided to respective mixers included in the HRM. For example, the HRM multiplies odd number-times an LO signal to be provided to the respective mixers 1400-2, 1400-3 using the frequency converters 1430-1, 1430-2 illustrated in FIG. 14.

After generating a frequency to be provided to the respective mixers, the HRM proceeds to step 1607 to control the phase of an LO signal to be provided to the respective mixers with consideration of a delay time between the LO and the respective mixers. For example, in the case where a small number of delay cells exist between the LO 1450 and the first mixer 1400-1, a delay time by transmission of the LO signal becomes small, so that the phase of the LO signal precedes the phase of LO signals transmitted to the other mixers 1400-2, 1400-3 via different paths. Accordingly, the HRM controls the phase of the LO signal for the first mixer 1400-1 via the first phase controller 1410-1 so that the phase of the LO signal for the first mixer 1400-1 may be the same as the phase of LO signals of the other mixers 1400-2, 1400-3.

After that, the HRM proceeds to step 1609 to convert the received RF signal to an IF signal at each mixer using the phase-controlled LO signal.

After generating the IF signal, the HRM proceeds to step 1611 to combine the generated IF signal to generate a harmonic component-removed signal. For example, as illustrated in FIG. 14, the HRM controls the magnitude and the phase of a signal down-converted by the second mixer 1400-2 and the third mixer 1400-3 using the attenuators 1420-1, 1420-2, and the phase converters 1440-1, 1440-2. After that, the HRM combines an output signal of the first mixer 1400-1 with signals provided from the first phase converter 1440-1 and the second phase converter 1440-2 using the combiner 1460.

After that, the HRM ends the present algorithm.

As described above, harmonic components are removed using the HRM that uses multi LO frequencies, so that power control and calibration of the HRM can be easily performed, and a chip size by power control and calibration can be reduced.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. An apparatus of a Harmonic Rejection Mixer (HRM) for removing a harmonic component, the apparatus comprising:
   a Local Oscillator (LO) configured to generate a Local Oscillation (LO) signal;
   at least one frequency converter configured to multiply the LO signal using different variables to provide the LO signal to at least one mixer;
   at least two mixers configured to convert a frequency band of a same input signal using the LO signal provided from the LO and the at least one frequency converter;
   at least one phase converter configured to control a phase of an output signal of at least one other mixer excluding one of the at least two mixers; and
   a combiner configured to combine an output signal of the one of the at least two mixers with an output signal of the at least one phase converter.

2. The apparatus of claim 1, further comprising:
   at least one attenuator configured to control a magnitude of an output signal of the at least one other mixer so that a magnitude of a harmonic component included in an output signal of the one mixer is the same as a magnitude of an output signal of the at least one other mixer,
   wherein the at least one phase converter controls a phase of a signal provided from the at least one attenuator.

3. The apparatus of claim 1, further comprising:
   at least one attenuator configured to control a magnitude of an odd number-multiplied LO signal to be provided from the at least one frequency converter to the at least one other mixer so that a magnitude of a harmonic component included in an output signal of the one mixer is the same as a magnitude of an output signal of the at least one other mixer, and to provide the magnitude-controlled LO signal to the at least one other mixer, or to control a magnitude of an input signal input to the at least one other mixer so that a magnitude of a harmonic component included in an output signal of the one mixer is the same as a magnitude of an output signal of the at least one other mixer, and to provide the magnitude-controlled input signal to respective mixers.

4. The apparatus of claim 1, further comprising:
at least two power controllers configured to determine whether to drive each of the at least two mixers with consideration of a harmonic component of the input signal.

5. The apparatus of claim 1, further comprising:
at least two gain controllers configured to control intensity of an output signal of each of the at least two mixers depending on a mechanical error of each of the at least two mixers, or
at least two phase controllers configured to control a phase difference of a multiplied LO signal provided to each of the at least two mixers.

6. The apparatus of claim 5, wherein the at least two phase controllers select one of at least two paths comprising a different number of delay cells with consideration of a delay time of LO signals provided to the at least two mixers, respectively; and provide the multiplied LO signal to a relevant mixer via the selected one of paths.

7. The apparatus of claim 1, wherein the at least one frequency converter multiplies the LO signal by different odd numbers; and provides LO signals multiplied by the different odd numbers to respective mixers.

8. The apparatus of claim 1, wherein the at least one phase converter controls a phase value of the at least one other signal or changing a sign of the at least one other signal.

9. The apparatus of claim 1, wherein one of the at least two mixers controls a magnitude of a signal whose frequency band has been changed using a gain set in advance or Gm cell.

10. A method for removing a harmonic component using a Harmonic Rejection Mixer (HRM), the method comprising:
generating a Local Oscillation (LO) signal;
multiplying an LO signal to be provided to each of at least one other mixer excluding one of at least two mixers using different variables;
mixing, at the at least two mixers, one of the LO signal and the multiplied LO signal with a same input signal to generate at least two signals whose frequency bands have been converted;
controlling a phase of at least one other signal excluding one of the at least two signals; and
combining the one of the at least two signals with the phase-controlled at least one other signal.

11. The method of claim 10, wherein multiplying the LO signal comprises:
multiplying the LO signal by different odd numbers; and
providing LO signals multiplied by the different odd numbers to respective mixers.

12. The method of claim 10, wherein controlling the phase comprises:
controlling a phase value of the at least one other signal or changing a sign of the at least one other signal.

13. The method of claim 10, further comprising:
generating the at least two signals, and before controlling the phase of at least one other signal, controlling a magnitude of the at least one other signal so that a magnitude of a harmonic component included in the one signal is the same as a magnitude of the at least one other signal,
wherein controlling the phase comprises controlling a phase of the magnitude-controlled at least one other signal.

14. The method of claim 10, further comprising:
generating the at least two signals, and before controlling the phase of at least one other signal, controlling, at one of the at least two mixers, a magnitude of a signal whose frequency band has been changed using a gain set in advance or $G_m$ cell.

15. The method of claim 10, further comprising:
multiplying the LO signal, and before generating the at least two signals, controlling a magnitude of an odd number-multiplied LO signal to be provided to at least one mixer for generating the at least one other signal so that a magnitude of a harmonic component included in the one signal is the same as a magnitude of the at least one other signal.

16. The method of claim 10, further comprising:
before generating the at least two signals, controlling a magnitude of an input signal provided to at least one mixer for generating the at least one signal so that a magnitude of a harmonic component included in the one signal is the same as a magnitude of the at least one other signal.

17. The method of claim 10, further comprising:
before generating the at least two signals, selecting at least one mixer to be driven among the at least two mixers with consideration of a harmonic component of the input signal,
wherein generating the at least two signals comprises generating at least one signal using the selected at least one mixer.

18. The method of claim 10, further comprising:
after generating the at least two signals, controlling intensity of the generated at least two signals depending on a mechanical error of each of the at least two mixers, or
multiplying the LO signal, and before generating the at least two signals, controlling a phase difference of the multiplied LO signals provided to the at least two mixers, respectively.

19. The method of claim 18, wherein controlling the phase difference comprises:
selecting one of at least two paths comprising a different number of delay cells with consideration of a delay time of LO signals provided to the at least two mixers, respectively; and
providing the multiplied LO signal to a relevant mixer via the selected one of paths.

* * * * *